United States Patent
Kwok et al.

(10) Patent No.: US 12,444,693 B2
(45) Date of Patent: Oct. 14, 2025

(54) ELECTROMAGNETIC INTERFERENCE SHIELDING DEVICE COMPRISING A FLAME RETARDING, THERMAL INTERFACE MATERIAL COMPOSITE, AND METHOD FOR PREPARATION THEREOF

(71) Applicant: Nano and Advanced Materials Institute Limited, Hong Kong (HK)

(72) Inventors: Chi Ho Kwok, Hong Kong (HK); Xiaohua Chen, Hong Kong (HK); Wai Chung Li, Hong Kong (HK); Chenmin Liu, Hong Kong (HK)

(73) Assignee: Nano and Advanced Materials Institute Limited, Hong Kong (HK)

( * ) Notice: Subject to any disclaimer, the term of this patent is extended or adjusted under 35 U.S.C. 154(b) by 978 days.

(21) Appl. No.: 17/530,483

(22) Filed: Nov. 19, 2021

(65) Prior Publication Data

US 2022/0165681 A1 May 26, 2022

Related U.S. Application Data

(60) Provisional application No. 63/118,021, filed on Nov. 25, 2020.

(51) Int. Cl.
*H01L 23/552* (2006.01)
*C01B 32/21* (2017.01)
(Continued)

(52) U.S. Cl.
CPC ............ *H01L 23/552* (2013.01); *C01B 32/21* (2017.08); *H01F 1/0018* (2013.01); *H01F 1/344* (2013.01);
(Continued)

(58) Field of Classification Search
CPC .... B32B 2250/02–05; B32B 2262/106; B32B 2250/24–248; B32B 2264/108;
(Continued)

(56) References Cited

U.S. PATENT DOCUMENTS 8,431,048 B2   4/2013  Kuczynski et al.
8,632,879 B2   1/2014  Weisenberger
(Continued)

FOREIGN PATENT DOCUMENTS

CN    101768427 B    6/2012
CN    103119091 A    5/2013
(Continued)

OTHER PUBLICATIONS

WO2019-244889 including English abstract (Year: 2019).*
(Continued)

*Primary Examiner* — Holly Rickman
(74) *Attorney, Agent, or Firm* — IDEA Intellectual Limited; Sam T. Yip

(57) ABSTRACT

The present invention provides an EMI shielding device including a flame retarding, thermal interface material composite with a through plane thermal conductivity of no less than 30 W/mK and a dielectric withstanding voltage of no less than 1 kV/mm, where the composite includes at least one dielectric layer of self-aligned, carbon-based materials associated with superparamagnetic particles and at least one layer of fillers including a blend of dielectric heat transfer materials with a thermal or UV curable polymer or phase change polymer. The anisotropic heat transfer carbon-based materials associated with superparamagnetic materials are aligned under a low magnetic field strength of less than 1 Tesla to an orientation that results in a high thermal conductivity direction which can conduct the maximum heat from the adjacent device of the present composite. The
(Continued)

present invention also provides a method for preparing the composite.

16 Claims, 7 Drawing Sheets

(51) Int. Cl.
- H01F 1/00 (2006.01)
- H01F 1/34 (2006.01)
- B82Y 25/00 (2011.01)
- B82Y 30/00 (2011.01)
- C01G 49/08 (2006.01)

(52) U.S. Cl.
CPC ............... B82Y 25/00 (2013.01); B82Y 30/00 (2013.01); C01G 49/08 (2013.01); C01P 2004/20 (2013.01); C01P 2004/64 (2013.01); C01P 2006/40 (2013.01); C01P 2006/42 (2013.01)

(58) Field of Classification Search
CPC ........... B32B 25/02; B32B 7/03; B32B 7/025; B32B 7/027; H01L 23/552; H01L 23/3737; H01K 9/0073; H01F 1/0018; H01F 1/344; H01F 1/0063; C01B 32/21; B82Y 25/00; B82Y 30/00; C01P 2004/20; C01P 2004/64; C01P 2006/40; C01P 2006/42
See application file for complete search history.

(56) References Cited

U.S. PATENT DOCUMENTS

| 9,111,899 | B2 | 8/2015 | Bartley et al. |
| 11,993,679 | B2* | 5/2024 | Kudoh .................. C08K 7/06 |
| 2004/0000415 | A1 | 1/2004 | Rizzo et al. |
| 2006/0251897 | A1 | 11/2006 | Pan et al. |
| 2010/0172101 | A1 | 7/2010 | Yao et al. |
| 2016/0326419 | A1* | 11/2016 | Balandin .................. C09D 7/62 |
| 2019/0162491 | A1 | 5/2019 | Sun et al. |
| 2019/0323785 | A1 | 10/2019 | Eid et al. |

FOREIGN PATENT DOCUMENTS

| CN | 103396642 A | 11/2013 |
| CN | 103748681 A | 4/2014 |
| CN | 103025653 B | 11/2015 |
| CN | 105542728 A | 5/2016 |
| CN | 111944224 A | 11/2020 |
| WO | WO-2019244889 A1 * | 12/2019 ............. C08G 77/06 |

OTHER PUBLICATIONS

Akash Mohanty et al., "Dielectric breakdown performance of alumina/epoxy resin nanocomposites under high voltage application", Materials and Design 47 (2013), pp. 711-716.

Mehdi Salehirad et al., "Synthesis and characterization of functionalized Fe3O4/boron nitride as magnetically alignable 2D-nanofiller to improve the thermal conductivity of epoxy nanocomposites", Industrial & Engineering Chemistry Research, 2018, pp. 1-43.

"3M™ Boron Nitride Cooling Fillers", www.3M.com/thermalmanagement, 2018, pp. 1-8.

Office Action of the corresponding China patent application No. 202111408040.6 mailed on Jul. 9, 2024.

* cited by examiner

ELECTROMAGNETIC INTERFERENCE SHIELDING DEVICE COMPRISING A FLAME RETARDING, THERMAL INTERFACE MATERIAL COMPOSITE, AND METHOD FOR PREPARATION THEREOF

CROSS-REFERENCE TO RELATED APPLICATIONS

This application claims priority from a U.S. provisional patent application Ser. No. 63/118,021 filed Nov. 25, 2020, and the disclosure of which is incorporated herein by reference in its entirety.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The present invention relates to an electromagnetic interference (EMI) shielding device comprising a fire retarding, thermal interface material composite with an anisotropic heat transfer property, good thermal conductivity, and high voltage withstanding, and also relates to a method for preparing thereof.

BACKGROUND

With a continuous increase in cooling demand for microprocessors, there has been an increased focus within the industry on developing new thermal solutions. Thermal interface materials (TIMs) play a key role in thermally connecting various components as the thermal solution. The rapid increase in power densities in electronics makes efficient heat removal an important issue in the development of integrated circuits (ICs), systems or even ultra-fast high-power density tele-communication devices, which become severe in this technological advance century.

In theory, when two solid surfaces are joined, asperities on each of the surfaces limit the actual contact between the two solids to a very small fraction, e.g., there may be just 1-2% of the apparent area for the interfaces, and the flow of heat across such interface involves solid-to-solid conduction in the area of actual contact. In order to maximize the heat transfer efficiency, TIM was applied to fill up this gap and reduce the contact interface, thereby reducing the contact resistance.

Conventional TIMs filled with thermally conductive particles require high volume fraction of ceramic fillers (over 60%) to achieve thermal conductivity in the range of 1-10 W/mK at room temperature, which are not very efficient. On the other hand, by utilizing highly thermally conductive heat transfer materials, such as carbon nanotubes (CNTs), carbon fibers (CFs) and graphene, to incorporate into the existing composite and formulation can further improve the thermal conductivities. However, the thermal conductivity improvement and the practical application are limited by the prohibitive cost.

US Patent Application Publication No. US2010/0172101 provided a TIM including a CNT array having super-aligned CNTs, a matrix and heat conductive particles well dispersed in the matrix formed on both ends of the array, and the heat conductive particles can be metal, alloy, oxide, or non-metal, and the main purpose of this patent is to provide a conductive channel between the thermal interface material by decreasing thermal contact resistance between the TIM and the electronic components through dispersing the heat conductive particles onto the matrix followed by melting the matrix, where the dispersing of the heat conductive particles is due to gravity. Using this method to disperse the heat conductive particles is restricted by the liquid state characteristic of the material forming the matrix. This patent is also silent at any EMI shielding properties.

US Patent Application Publication No. US2019/0162491 provided a thermally-anisotropic thermal interface pad including a dielectric layer and a first heat conduction layer, where the first heat conduction layer has a plurality of substantially aligned fibers unidirectionally to a predetermined inclined angle against the plane of the dielectric layer so that heat is dissipated along a direction perpendicular to the dielectric layer. The alignment of the fibers is achieved by electrostatic method such as electroflocking. However, this type of electrostatic method is more suitable for alignment of one-dimensional carbon fiber-type material as the carbon fiber is a highly symmetrical material, therefore packing density is not an issue. However, if the material to be aligned is not highly symmetrical, e.g., graphite flake, in-plane or through plane directional alignment of which cannot be flocked so easily by this type of method. A more suitable approach to align a larger in size whilst less symmetrical material to ensure better packing uniformity is needed.

There is also a need for an efficient while cost-effective solution to formulate a new generation of thermal interface materials with outstanding EMI shielding properties.

SUMMARY OF THE INVENTION

Accordingly, in a first aspect of the present invention, there is provided an EMI shielding device comprising a flame retarding, thermal interface material composite with a through plane thermal conductivity of no less than 30 W/mK, in-plane thermal conductivity of no less than 10 W/mK and a dielectric withstanding voltage of no less than 1 kV/mm. The present composite includes:
  at least a first layer of self-aligned, carbon-based materials formed on at least one dielectric layer having a carbon content of about 85 to 99.9% associated with superparamagnetic particles with magnetic field strength of 60-90 amu/g such that an inclined angle between the carbon-based materials and a horizontal plane of the dielectric layer is adjustable between 90 and 45 degrees in the presence of less than 1 Tesla of magnetic field;
  at least a second layer of fillers comprising a blend of dielectric isotropic heat transfer materials with a thermal or UV curable polymer,
  wherein the first layer includes a plurality of ceramic fillers associated with a polymer to form a polymer matrix;
  each of the self-aligned, carbon-based materials has an aspect ratio of 3:1 to 6:1 and an average particle size between 0.1 and 1.0 mm;
  the superparamagnetic particles have an average particle size of less than 10 μm, magnetic field strength of about 60 to 90 amu/g, and provide the self-aligned driving force, carbon-based materials with an adjustable inclined angle between 90 and 45 degrees about the substrate of the dielectric layer in the presence of less than 1 Tesla of magnetic field; and the at least one dielectric layer and the at least one layer of fillers have at least 20% by volume overlapped with each other when the carbon-based materials are self-aligned in the presence of the magnetic field and tilted to an angle from about 0 to about 45 degrees against the direction of the magnetic field at the same plane.

In one embodiment, the dielectric layer comprises at least a plurality of dielectric isotropic ceramic materials.

In another embodiment, the dielectric layer further comprises a plurality of anisotropic ceramic materials which are aligned under magnetic field.

In one embodiment, the ceramic fillers include one or more of aluminum oxide, boron nitride, aluminum nitride and silica oxide, diamonds, and/or self-aligned ceramic anisotropic materials under the magnetic field.

In one embodiment, the polymer is selected from liquid acrylic, epoxy resin, polyurethane resin, unsaturated polyester resin, organic silicone resin, phase change materials or any combination thereof.

In one embodiment, the ceramic fillers and polymer are in a weight ratio of 30-10:1.

In one embodiment, the carbon-based materials comprise one or more of non-expended and/or expended graphite flakes, reduced and/or oxidized graphene flakes, carbon fibers, and/or any combination thereof.

In one embodiment, the dielectric isotropic heat transfer materials comprise one or more of aluminum oxide, boron nitride, aluminum nitride, silicon oxide, and/or any combination thereof.

In one embodiment, the thermal or UV curable polymer is selected from liquid acrylic, epoxy resin, polyurethane resin, unsaturated polyester resin, organic silicone resin, phase change material or any combination thereof.

In one embodiment, the dielectric isotropic heat transfer materials:the thermal or UV curable polymer are in a weight ratio of 5-2:1.

In one embodiment, the ceramic fillers are diffusible through the space between each of the aligned carbon-based materials upon application of vacuum.

In one embodiment, the dielectric isotropic heat transfer materials further comprise superparamagnetic particles.

In one embodiment, the superparamagnetic particles are selected from one or both of $Fe_2O_3$ and $Fe_3O_4$ with an average particle size of 100 nm to 10 μm in a concentration of 2-5 wt. % to the weight of carbon-based materials or the dielectric isotropic heat transfer materials.

In a second aspect of the present invention, a method for preparing the flame retarding, thermal interface material composite of the EMI shielding device in the first aspect is provided, where the method includes:

preparing a first mixture of superparamagnetic particles-associated carbon-based materials and a polymer for forming a first layer of aligned carbon-based materials on a dielectric layer;

applying a magnetic field of less than 1 Tesla in an angle across the first layer about a horizontal plane of the dielectric layer to orient the carbon-based materials associated with the superparamagnetic particles in a direction substantially the same as the direction of the magnetic field, such that an inclined angle between 90 and 45 degrees is provided between each of the carbon-based materials and the horizontal plane of the dielectric layer; dispersing a plurality of ceramic fillers through the gaps between the carbon-based materials in the first layer;

preparing a second mixture of dielectric isotropic heat transfer materials with a thermal or UV curable polymer for forming a second layer of dielectric isotropic heat transfer materials;

applying a magnetic field of less than 1 Tesla across the second layer of dielectric isotropic heat transfer materials in an angle that the dielectric isotropic heat transfer materials in the second mixture align in an orientation substantially the same as that of the aligned carbon-based materials in the first layer;

diffusing the ceramic fillers to the first and second layers through the space between each of the aligned carbon-based materials;

curing the first and second mixtures until the polymer in both of the mixtures are set.

In one embodiment, the carbon-based materials have a carbon content of about 85 to 99.9%.

In one embodiment, the ceramic fillers include one or more of aluminum oxide, boron nitride, aluminum nitride and silica oxide, diamonds, and/or self-aligned ceramic anisotropic materials under the magnetic field.

In one embodiment, the polymer is selected from liquid acrylic, epoxy resin, polyurethane resin, unsaturated polyester resin, organic silicone resin, or any combination thereof.

In one embodiment, the ceramic fillers and polymer are in a weight ratio of 3-7:1.

In one embodiment, the carbon-based materials comprise one or more of non-expended and/or expended graphite flakes, reduced and/or oxidized graphene flakes, carbon fibers, and/or any combination thereof.

In one embodiment, the dielectric isotropic heat transfer materials comprise one or more of aluminum oxide, boron nitride, aluminum nitride, silicon oxide, and/or any combination thereof. The dielectric isotropic heat transfer materials can be in spherical or flake with an average particle size of about 1 μm to 1000 μm.

In one embodiment, the thermal or UV curable polymer is selected from liquid acrylic, epoxy resin, polyurethane resin, unsaturated polyester resin, organic silicone resin, or any combination thereof.

In one embodiment, the dielectric isotropic heat transfer materials:the thermal or UV curable polymer are in a weight ratio of 5-2:1.

In one embodiment, the ceramic fillers are diffusible through the space between each of the aligned carbon-based materials upon application of vacuum.

In one embodiment, the dielectric isotropic heat transfer materials further comprises superparamagnetic particles.

In one embodiment, the superparamagnetic particles are selected from one or both of $Fe_2O_3$ and $Fe_3O_4$ with an average particle size of 100 nm to 10 μm and magnetic field strength of about 60 to 90 amu/g in a concentration of 2-5 wt. % to the weight of dielectric isotropic heat transfer materials.

In one embodiment, there can be more than two layers of aligned carbon-based and dielectric isotropic heat transfer materials before the topmost layer being covered by the dielectric thermal clay or dispersing the dielectric ceramic particles-polymer resin on top of the second layer.

In one embodiment, the method further includes covering the second layer, or if more than two layers of aligned carbon-based and dielectric isotropic heat transfer materials, the topmost layer, by a dielectric thermal clay or dispensing a dielectric ceramic particles-polymer resin on top of the second layer prior to said curing of the polymers in the first and second mixtures to form an additional dielectric layer.

The additional dielectric layer formed on the second or topmost layer of the anisotropic or isotropic heat transfer materials includes at least a plurality of dielectric isotropic heat transfer materials. More specifically, this additional dielectric layer may include a plurality of aligned anisotropic heat transfer materials.

Definitions

The terms "a" or "an" are used to include one or more than one and the term "or" is used to refer to a nonexclusive "or" unless otherwise indicated. In addition, it is to be understood that the phraseology or terminology employed herein, and not otherwise defined, is for the purpose of description only and not of limitation. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference should be considered supplementary to that of this document; for irreconcilable inconsistencies, the usage in this document controls.

In the methods of preparation described herein, the steps can be carried out in any order without departing from the principles of the invention, except when a temporal or operational sequence is explicitly recited. Recitation in a claim to the effect that first a step is performed, and then several other steps are subsequently performed, shall be taken to mean that the first step is performed before any of the other steps, but the other steps can be performed in any suitable sequence, unless a sequence is further recited within the other steps. For example, claim elements that recite "Step A, Step B, Step C, Step D, and Step E" shall be construed to mean step A is carried out first, step E is carried out last, and steps B, C, and D can be carried out in any sequence between steps A and E, and that the sequence still falls within the literal scope of the claimed process. A given step or sub-set of steps can also be repeated. Furthermore, specified steps can be carried out concurrently unless explicit claim language recites that they be carried out separately. For example, a claimed step of doing X and a claimed step of doing Y can be conducted simultaneously within a single operation, and the resulting process will fall within the literal scope of the claimed process.

Figure 1:
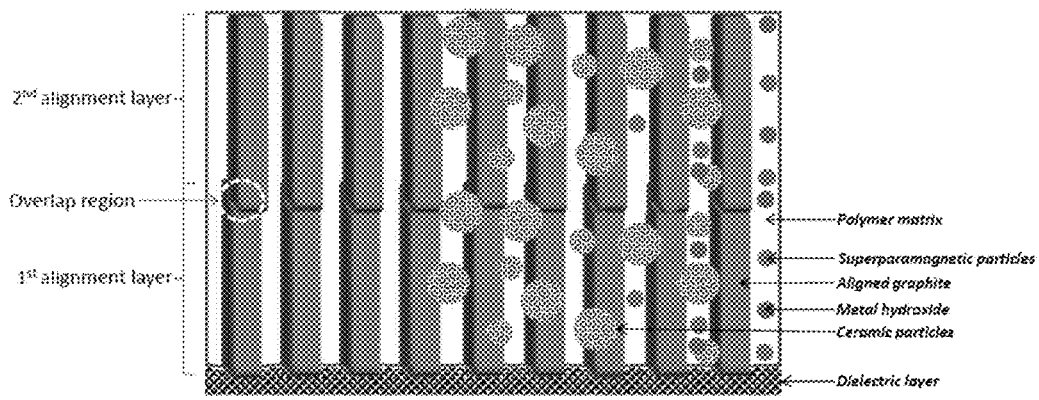
FIG. 1 illustrates the schematic diagram of a cross section on the thermal interface material, the aligned materials penetrated into the ceramic layer.

The following detailed description explains the preferred embodiments of the invention, together with advantages and features, by way of example with reference to the drawings.

DETAILED DESCRIPTION

The present invention will be described in detail through the following embodiments/examples with appending drawings. It should be understood that the specific embodiments are provided for an illustrative purpose only, and should not be interpreted in a limiting manner.

The present disclosure provides a thermal interface material (TIM) incorporated with carbon-based materials, preferably graphite flakes, as fillers with self-alignment ability for TIM fabrication in industrial environments.

The growing densities of dissipated heat require new types of TIMs for device and chip packages. Commercial TIMs reveal thermal conductivity in the range from 5 W/mK to 10 W/mK. Thermal conductivity enhancement can be achieved via alignment of highly thermal conductive materials associated with magnetically responsive compound/molecule such as superparamagnetic particles, which act as fillers in TIM matrix. Compared with graphene, carbon fibers and carbon nanotubes, graphite (in-plane Tc: 800-1000 W/mK) and boron nitride (in-plane Tc: 600 W/mK), graphite (in-plane Tc: 1500 W/mK) also showed anisotropic heat transfer properties but it is the lowest in material cost and accounted for the best materials among the anisotropic heat transfer materials/fillers. Graphite is 2-dimensional high aspect ratio material containing a few to hundreds stack of graphene layers while boron nitride also showed similar properties as they possess high in-plane thermal conductivity, which are expected to form a very efficient heat conduction pathway in polymer matrices.

In general, TIMs are composites which include a polymer matrix with thermally conductive filler particles. While conventional low aspect ratio fillers require a loading in the range of 60-150% to achieve an acceptable thermal conductivity, the present invention requires 60% or less thermal conductive fillers in the polymer matrix, because alignment of fillers with an external magnetic field during TIM dispersion provides a more efficient heat dissipation pathway than conventional TIMs, and the present invention shows dielectric withstanding properties which have not be discussed in prior arts.

Association of magnetic responsive particles with the graphite includes physically adhere on top of the graphite surface, e.g., physical adsorption on the surface, once the alignment occurs, an inclined angle between the central axis substantially perpendicular to the hexagonal plane of each of the graphene in the graphite flakes and the direction of the magnetic field is provided, e.g., from about 0 to 45 degrees.

The present invention provides a revolutionary new method of graphite alignment, which meets all industrial requirements for TIM characteristics and TIM dispersion to the mating surfaces. The fillers including carbon-based materials such as graphite, and ceramic fillers which are obtained by an inexpensive scalable technique can be functionalized via an external magnetic field. The alignment can be achieved using functionalization of the graphite surface with magnetic nanoparticles, such as $Fe_3O_4$. The nanoparticles can be attached via dry mixing process, physical adhesion or solution mixing followed by filtration. The present invention also provides an anisotropic heat transfer material/filler alignment process that can be performed during TIM dispersion to mating surfaces such as via utilization of sample holders with magnets and the magnets of the required strength can be those available commercially. For example, the magnets used in the present invention can be Neodymium (NdFeB) magnets with a low magnetic field strength of 1-5 Tesla. Preferably, the strength of magnetic field applied is less than 1 Tesla in the present invention.

The present invention provides a method for changing carbon-based materials/fillers into magnetically responsive.

The present method for the alignment of carbon-based materials/fillers is mainly under magnetic fields. It is based on assembly of superparamagnetic nanoparticles on the surface of graphite fillers. The method combines a layer-by-layer assembly and dielectric withstanding layer. Ceramic fillers were also added into the aligned structure to enhance the thermal conductivity.

In one embodiment, the magnetic nanoparticles can be attached to the anisotropic filler without using binders. This process can provide sufficient nanoparticles attachment on the fillers such that a portion of the magnetically functionalized fillers can be oriented with a magnetic field.

EXAMPLES

Referring to FIG. 1, the present composite is a multi-layered structure mainly composed of three layers: a dielectric layer, a first alignment layer, and a second alignment layer, wherein a portion of the first alignment layer overlaps with a portion of the second alignment layer, about 20% or less by volume. It is called overlap region in this example.

In an embodiment, the first alignment layer are formed on the dielectric layer from a first mixture including carbon-based anisotropic heat transfer materials with an aspect ratio of 3:1 to 6:1, and one or more polymers forming the polymer matrix of the first alignment layer. The carbon-based anisotropic heat transfer materials are associated with a plurality of superparamagnetic particles. The polymer forming the polymer matrix of the first alignment layer is thermal or UV curable.

Before the second alignment layer is formed on top of the first alignment layer, a magnetic field is applied in a direction substantially perpendicular to the horizontal plane of the dielectric layer or at an inclined angle against the horizontal plane of the dielectric layer such that the carbon-based anisotropic heat transfer materials associated with the superparamagnetic particles are aligned in the same direction as that of the magnetic field at the same plane. The inclined angle between the central axis of the aligned, carbon-based anisotropic heat transfer materials and the horizontal plane of the dielectric layer is between 45 degrees to 90 degrees in this embodiment; or the angle is a tilting angle which can be defined as the angle between the central axis of the aligned, carbon-based anisotropic heat transfer materials and the direction of the magnetic field at the same plane ranging from about 0 to about 45 degrees. It is possible that, according to the shape and curvature of the dielectric layer or the heat dissipation pathway, the carbon-based anisotropic heat transfer materials can be tilted to different angles along the surface of the dielectric layer by varying the direction of the magnetic field. After the alignment, a plurality of ceramic particles is dispersed onto the dielectric layer through the gap between the carbon-based materials.

Figure 2:
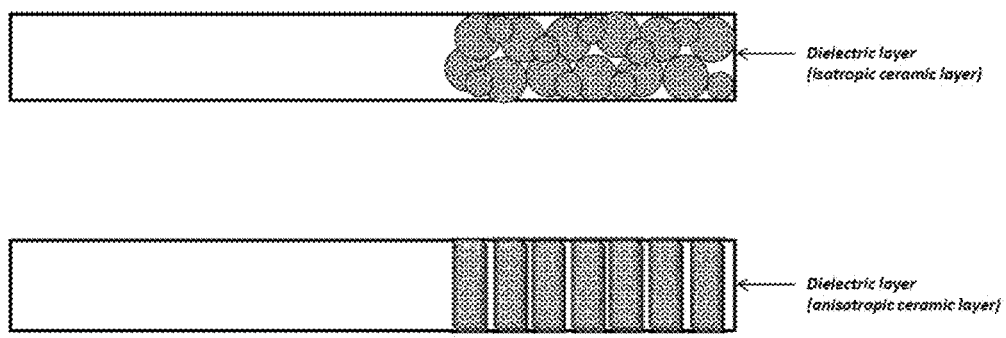
FIG. 2 illustrates the design and possibility of the dielectric layer.

Referring to FIG. 2, the upper schematic diagram shows how the isotropic particles are arranged in a dielectric layer of the present composite. The lower schematic diagram shows how the anisotropic carbon-based materials are arranged in a dielectric layer after alignment. The anisotropic carbon-based materials with an aspect ratio of 3:1 to 6:1 associated with superparamagnetic particles can be aligned according to the direction of the magnetic field applied to the dielectric layer.

Figure 3:
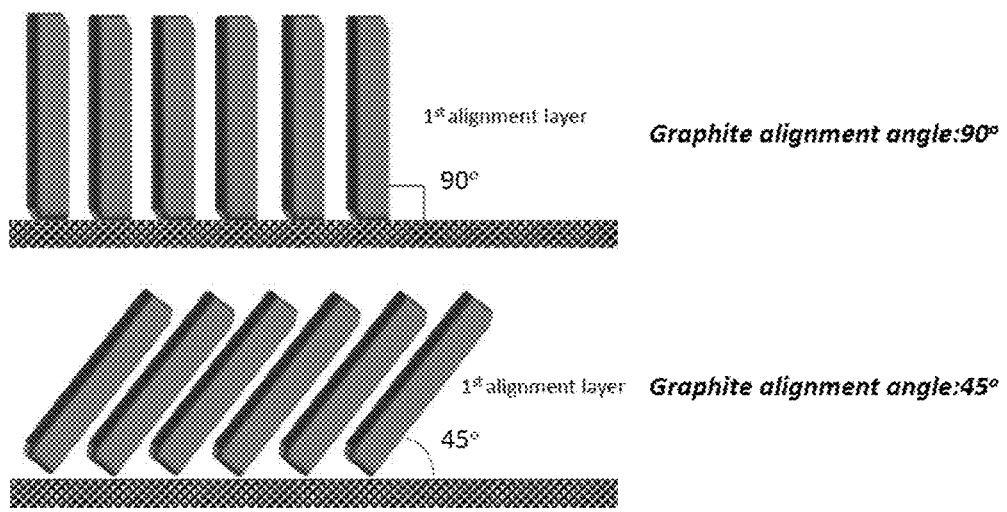
FIG. 3 illustrates the inclined angle of the anisotropic materials, from 90 degree to 45 degree.

Referring to FIG. 3, the upper schematic diagram shows an example of aligning the carbon-based materials, e.g., graphite flakes, associate with the superparamagnetic particles at an angle of about 90 degrees against the horizontal plane of the dielectric layer, i.e., the central axis of the graphite flakes is almost perpendicular to the horizontal plane of the dielectric layer. The lower schematic diagram shows an example of aligning the graphite flakes to an orientation that the central axis of the graphite flakes is tilted to an angle of about 45 degrees against the horizontal plane of the dielectric layer. These examples aim to illustrate that the alignment of the graphite flakes is adjustable according to the direction of the magnetic field applied to the first alignment layer having the graphite flakes which are associated with the superparamagnetic particles. Before the polymer of the first and second alignment layers are cured to form a more rigid matrix, the alignment angle of the graphite flakes against the horizontal plane of the dielectric layer can still be adjusted according to the needs.

One of the key considerations of aligning the anisotropic heat transfer materials in the polymer matrix is the heat transfer or dissipation pathway required by the devices incorporated with the present composite as its heat transfer or dissipation element. The high thermal conductivity (Tc) direction is substantially perpendicular to the central axis of the hexagonal plane of the graphite plates, whereas the low Tc direction is substantially parallel to the central axis of the hexagonal plane of the graphite plates (as shown in the top left and right schematic diagrams of FIG. 4A, respectively). In theory, superparamagnetic nanoparticles can give magnetic response under magnetic field only. So, its magnetic response can be "on and off" via applying or removing of the magnetic field. Since the superparamagnetic nanoparticles will adhere on the graphite surface, once magnetic field is applied, they will give magnetic responses which the field direction aligns with the external field, resulting that the graphite will be aligned in the highest thermal conductivity direction. The trigger of the magnetic field change in superparamagnetic nanoparticles would result in a driving force to align the graphite in a single orientation (top left panel of FIG. 4A). In top panel of FIG. 4B, the arrows indicate the magnetic field direction, and once magnetic field (B-field) is applied, the graphite will orient in a single direction, resulting in a driving force to align material. The alignment direction would be related to the magnetic field distribution. When the magnetic field direction is changed by 90 degrees, the previous orientation of the graphite flakes is theoretically flipped by 90 degrees so that the high Tc direction is changed by 90 degrees accordingly (top right panel of FIG. 4A).

Figure 4A:
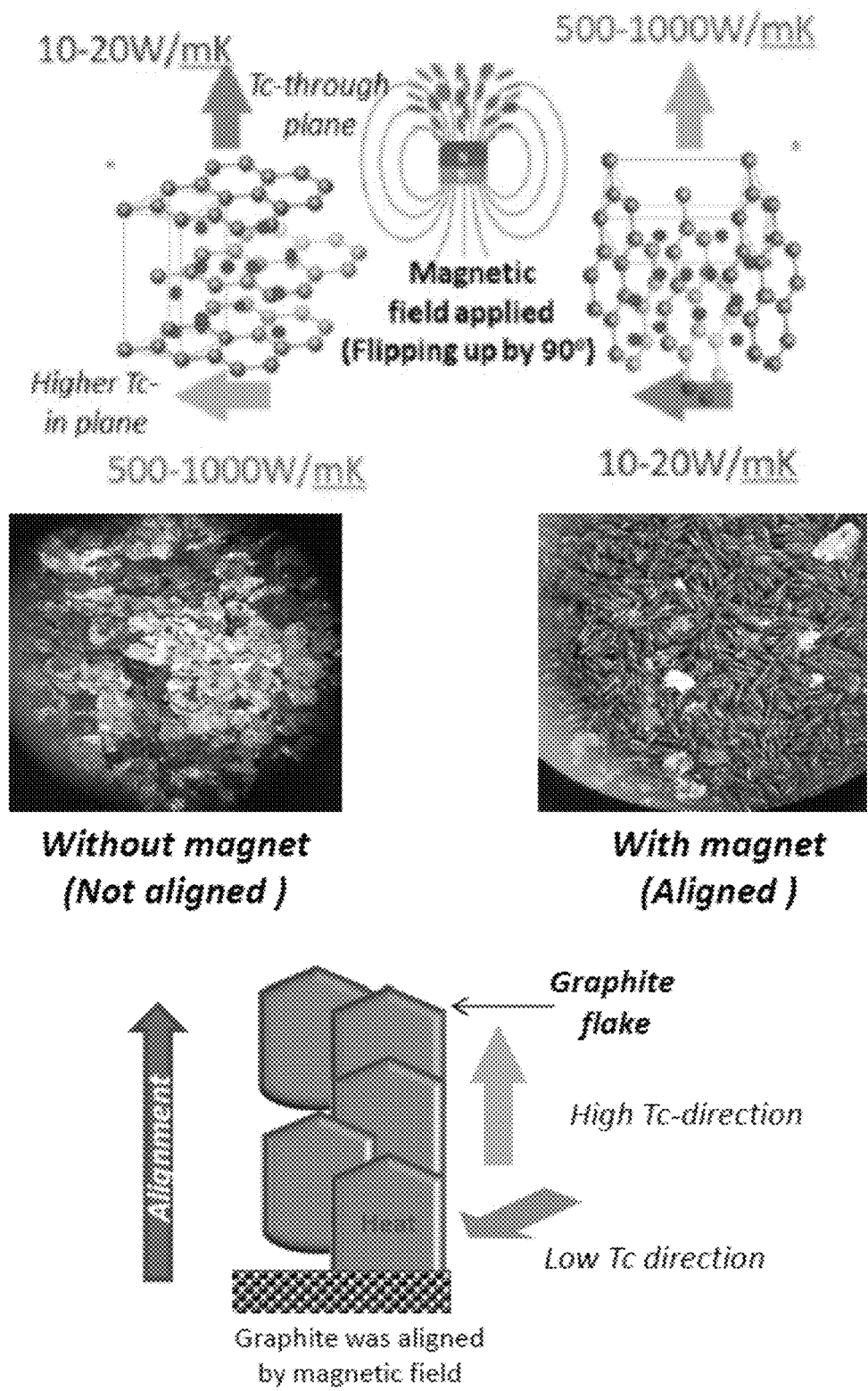
FIG. 4A illustrates the magnetically functionalized graphite flakes with magnetic field and without magnetic field.
Figure 4B:
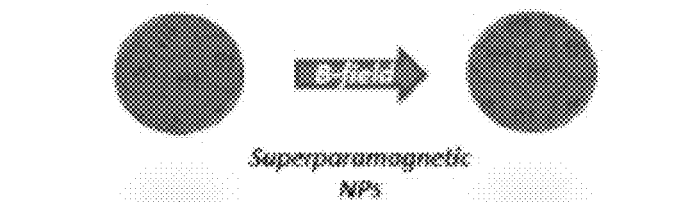
FIG. 4B illustrates schematically how the orientation of the functionalized graphite flakes together with the ceramic particles in a polymer matrix of the corresponding layers of the present invention is adjusted under the application of magnetic field in order to achieve the desired alignment.
Figure 4B:
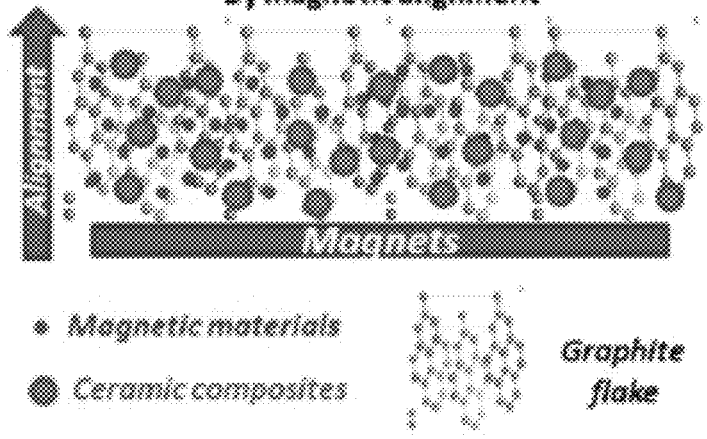

Referring to FIG. 4A, the two photos in the middle panel show the morphology of the graphite flakes associated with the superparamagnetic particles under the magnetic alignment (middle right) and no magnetic alignment (middle left).

The schematic diagram at the bottom of FIG. 4A illustrates when the graphite flakes are aligned in an orientation that the high Tc direction is pointing vertically away from the dielectric layer, the heat generated from an adjacent device to the present composite is conducted away from the device through the dielectric and then gone through the heat dissipation pathway along the high Tc direction. By such alignment, an efficient heat dissipation pathway is generated without using high volume of ceramic fillers in the polymer matrix as in most of the convention TIMs. An example of magnetic alignment of functionalized graphite flakes within the polymer matrix of ceramic particles is illustrated in the lower panel of FIG. 4B.

Figure 5:
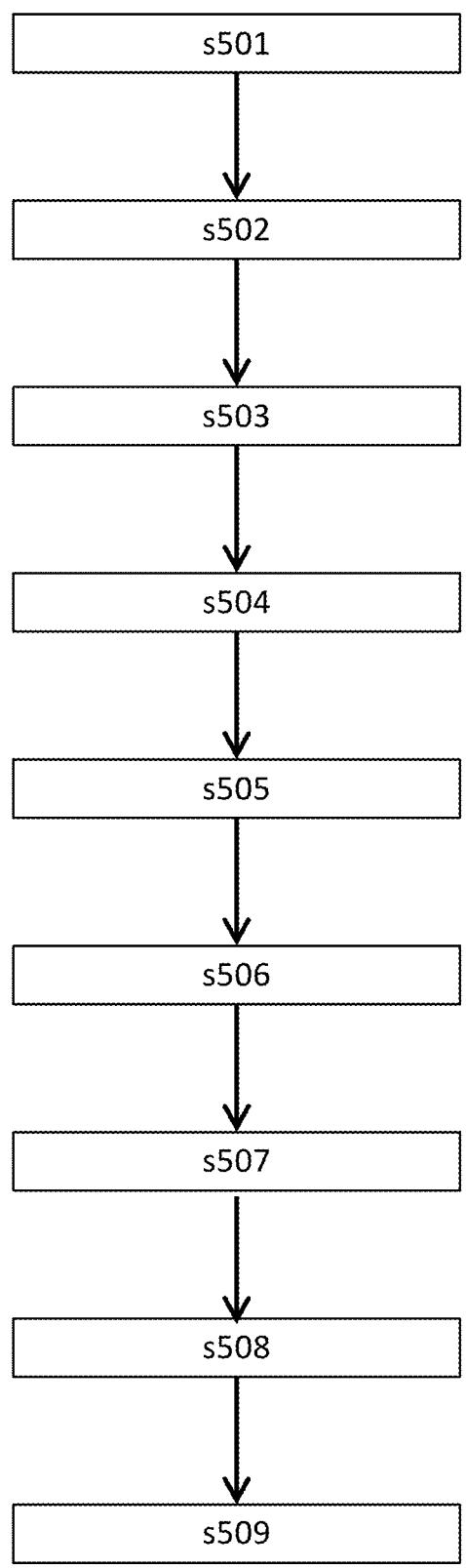
FIG. 5 is a flow chart illustrating an example of the preparation of the aligned anisotropic thermal pad of this invention.

Referring to FIG. 5, a preferred embodiment of the method for preparing the present composite is illustrated in a flowchart. The method includes:

s501: functionalizing graphite flakes with superparamagnetic responsive materials by wet mix or dry mix method;

s502: aligning the superparamagnetic responsive particles functionalized graphite flakes to mating surfaces such as sample holders where a bottom dielectric layer including at least a plurality of dielectric, isotropic heat transfer materials;

s503: applying a magnetic field of less than 1 Tesla to align the functionalized graphite flakes into a desired orientation;

s504: dispersing ceramic particles-polymer resin into a first layer of aligned graphite flakes array, followed by applying vacuum to diffuse the resin through the gap between the aligned functionalized graphite flakes;

s505: aligning a second layer of superparamagnetic responsive particles functionalized graphite flakes onto the first layer;

s506: applying a magnetic field of less than 1 Tesla to align the functionalized graphite flakes into a desired orientation s507: dispersing ceramic particles-polymer resin into the second layer of aligned graphite flakes array, followed by applying vacuum to diffuse the ceramic particles-polymer resin through the gap between the aligned functionalized graphite flakes;

s508: optionally covering the second or topmost layer (if there are more than two layers of aligned graphite flakes) by a dielectric thermal clay or dispensing a dielectric ceramic particles-polymer resin on top of the second or topmost layer;

s509: thermal or UV curing the polymer in both the first and second mixtures to form two layers of polymers containing the aligned graphite flakes and dielectric isotropic heat transfer materials onto the dielectric layer.

Figure 6:
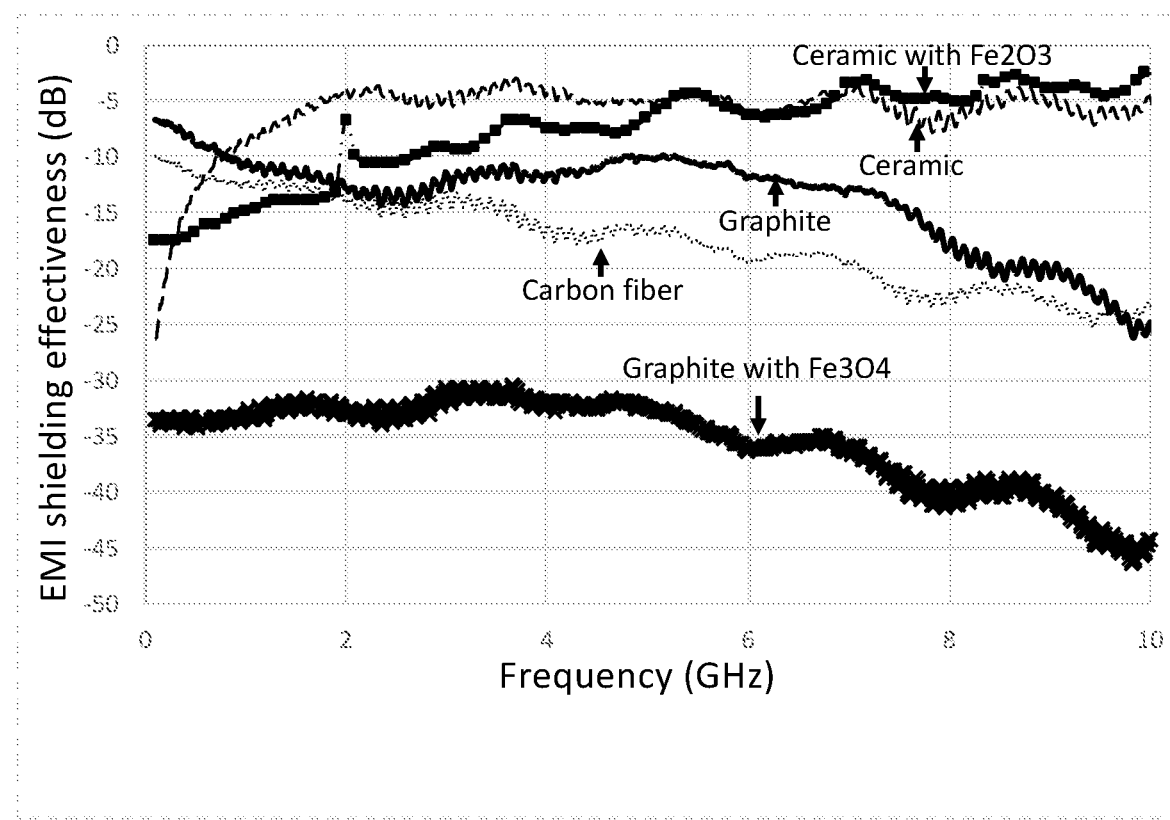
FIG. 6 illustrates an electromagnetic interference (EMI) shielding effectiveness (SE) test of the present invention (aligned graphite flakes with $Fe_3O_4$ nanoparticles) versus the conventional EMI shielding or thermal insulation material composites or pads.

Referring to FIG. 6, the present composite is subject to EMI SE test with other conventional EMI shielding material (carbon fiber pad), TIM pad also composed of aligned graphite but without superparamagnetic materials by Panasonic, some other conventional (ceramic) TIM and conventional (ceramic) TIM with Fe3O4. Comparing the EMI SE between carbon fiber pad and the present composite from low frequency to high frequency of EM waves, it shows a higher EMI SE in the present composite than the conventional EMI shielding carbon fiber pad (the more negative the value in dB of the EMI shielding is, the higher is the EMI SE). The difference is more significant at higher frequency of EM waves. The EMI SE of the present composite is also higher than that of conventional TIM composites or pads such as that by Fujipoly, the three different configurations by HFC, and the aligned graphite pad by Panasonic. In particular, the one by Panasonic with aligned graphites in the TIM pad has almost half or more than half the EMI SE of the present composite, suggesting that the incorporation of superparamagnetic particles into the aligned graphite flakes in the present invention synergistically enhances the EMI SE of the conventional graphite-based EMI shielding material. In addition, another EMI absorber pad with ceramic and ferric oxide (Fe2O3) as fillers have also been studied. It was found that the EMI SE is higher in low frequency region (<5 GHz) while performance will be reduced upon frequency increased to 10 GHz. Incorporating graphite flakes with superparamagnetic nano-particles magnetite (Fe3O4) can enhance the EM waves shielding ability by tackling both electric fields and magnetic fields simultaneously, resulting in a boost in shielding effectiveness as compared with similar carbonaceous or iron based materials in the market. The thermal conductivity of present composite show anisotropic thermal conductivity, with through plane thermal conductivity of 35 W/mK while in-plane thermal conductivity of 15 W/mK. In other words, the incorporated superparamagnetic particles in the present invention make the present invention become an ideal EMI shielding device, in addition to its thermal insulation property.

INDUSTRIAL APPLICABILITY

The present invention reduces the chance of air void formation in the contact interface of the TIMs such that the resulting composite can be an efficient heat sink of electronics and other devices requiring high thermal conductivity/dissipation. Because the present composite is soft and deformable without affecting its thermal conductivity and other performance such as high voltage withstanding, it can be used in many wearables which require a certain degree of flexibility. The fire retarding property of the present composite also makes it easier to meet certain fire test standards. The outstanding EMI SE of the present invention also makes it an ideal EMI shielding device to be applied in wide range of apparatuses and systems.

The invention claimed is:

1. An electromagnetic interference (EMI) shielding device comprising a flame retarding, thermal interface material composite with shielding effectiveness of 30-50 dB at a frequency range of 0 to 10 GHz, a through plane thermal conductivity of no less than 30 W/mK and an in-plane thermal conductivity of no less than 10 W/mK, a dielectric withstanding voltage of no less than 1 kV/mm, the composite comprising:

at least a first layer of self-aligned, carbon-based materials formed on at least one dielectric layer having a carbon content of about 85 to 99.9% associated with superparamagnetic particles with magnetic field strength of 60-90 amu/g such that an inclined angle between the carbon-based materials and a horizontal plane of the dielectric layer is adjustable between 90 and 45 degrees in the presence of less than 1 Tesla of magnetic field;

at least a second layer of fillers comprising a blend of dielectric isotropic heat transfer materials with a thermal or UV curable polymer or phase change polymer, the first layer comprising a plurality of ceramic fillers associated with a polymer to form a polymer matrix, each of the self-aligned, carbon-based materials having an aspect ratio of 3:1 to 6:1 and an average particle size between 0.1 and 1.0 mm, the superparamagnetic particles having an average particle size of less than 10 μm, magnetic field strength of about 60 to 90 amu/g and providing the self-aligned driving force, carbon-based materials with an adjustable inclined angle between 90 and 45 degrees about the horizontal plane of the dielectric layer in the presence of less than 1 Tesla of magnetic field, wherein the concentration of the superparamagnetic particles is 2-5 wt. % to the weight of carbon-based materials, at least 20% of the first layer overlaps and at least 20% of the second layer when the carbon-based materials are self-aligned in the presence of the magnetic field and tilted to an angle from 0 to about 45 degrees against the direction of the magnetic field at the same plane.

2. The device of claim 1, wherein the ceramic fillers comprise one or more of aluminum oxide, boron nitride, aluminum nitride and silica oxide, diamonds, and/or aligned ceramic anisotropic materials.

3. The device of claim 1, wherein the polymer is selected from liquid acrylic, epoxy resin, polyurethane resin, unsaturated polyester resin, organic silicone resin, phase change material or any combination thereof.

4. The device of claim 1, wherein the ceramic fillers and polymer are in a weight ratio of 10-30:1, infiltrated into the aligned carbon-based material array.

5. The device of claim 1, wherein the carbon-based materials comprise one or more of non-expended and/or expended graphite flakes, reduced and/or oxidized graphene flakes, carbon fibers, carbon nanotubes and/or any combination thereof.

6. The device of claim 1, wherein the superparamagnetic particles are selected from one or both of $Fe_2O_3$ and $Fe_3O_4$ with an average particle size of 100 nm to 10 μm, magnetic field strength of about 60 to 90 amu/g.

7. The device of claim 1, wherein the dielectric isotropic heat transfer materials comprise one or more of aluminum oxide, boron nitride, aluminum nitride, silicon oxide, and/or any combination thereof, in spherical or flake with an average size of particle 1 nm to 100 μm.

8. The device of claim 7, wherein the thermal or UV curable polymer is selected from liquid acrylic, epoxy resin, polyurethane resin, unsaturated polyester resin, organic silicone resin, phase change materials or any combination thereof.

9. The device of claim 8, wherein the dielectric isotropic heat transfer materials: thermal or UV curable polymer are in a weight ratio of 20-30:1.

10. The device of claim 9, wherein the ceramic fillers are diffusible through the space between each of the aligned carbon-based materials upon application of vacuum infiltration.

11. The device of claim 8, wherein the blend of dielectric isotropic heat transfer materials with a thermal or UV curable polymer further comprises superparamagnetic particles.

12. The device of claim 11, wherein the superparamagnetic particles are one or both of $Fe_2O_3$ and $Fe_3O_4$ with an average particle size of 10 nm to 10 μm, magnetic field strength of about 60 to 90 amu/g in a concentration of 2-5 wt. % to the weight of carbon-based materials.

13. The device of claim 1, wherein the at least one dielectric layer comprises at least a plurality of dielectric isotropic heat transfer materials.

14. The device of claim 13, wherein the at least one dielectric layer further comprises a plurality of aligned anisotropic heat transfer materials under an application of less than 1 Tesla of a magnetic field.

15. The device of claim 1, further comprising an additional dielectric layer formed on the second layer or a topmost layer if more than the first and second layers are formed on the bottommost dielectric layer, wherein the additional dielectric layer comprises at least a plurality of dielectric isotropic heat transfer materials.

16. The device of claim 15, wherein the additional dielectric layer further comprises a plurality of aligned anisotropic heat transfer materials under an application of less than 1 Tesla of a magnetic field.

* * * * *